United States Patent
West et al.

(10) Patent No.: US 6,850,858 B1
(45) Date of Patent: Feb. 1, 2005

(54) METHOD AND APPARATUS FOR CALIBRATING A METROLOGY TOOL

(75) Inventors: Craig A. West, Austin, TX (US); Gregory P. Hughes, Austin, TX (US); Kent B. Ibsen, Austin, TX (US)

(73) Assignee: DuPont Photomasks, Inc., Round Rock, TX (US)

( * ) Notice: Subject to any disclaimer, the term of this patent is extended or adjusted under 35 U.S.C. 154(b) by 106 days.

(21) Appl. No.: 10/189,082

(22) Filed: Jul. 3, 2002

Related U.S. Application Data

(60) Provisional application No. 60/303,382, filed on Jul. 6, 2001.

(51) Int. Cl.[7] .................. G01C 19/00; G01C 25/00; G01D 18/00; G01F 25/00; G06F 19/00
(52) U.S. Cl. .................. 702/104; 702/97; 356/237.2; 356/401; 356/328; 324/765; 430/22; 430/30; 257/5; 703/13; 716/4
(58) Field of Search .................. 702/97, 104; 356/237.2, 356/401, 328; 324/765; 430/22, 30; 257/5; 250/237 G; 716/4; 703/13

(56) References Cited

U.S. PATENT DOCUMENTS

| | | | | |
|---|---|---|---|---|
| 5,383,136 A | * | 1/1995 | Cresswell et al. | 702/97 |
| 5,602,492 A | * | 2/1997 | Cresswell et al. | 324/763 |
| 5,965,309 A | * | 10/1999 | Ausschnitt et al. | 430/30 |
| 6,301,008 B1 | * | 10/2001 | Ziger et al. | 356/401 |
| 6,581,193 B1 | * | 6/2003 | McGhee et al. | 716/4 |
| 6,597,447 B1 | * | 7/2003 | Stirton et al. | 356/237.2 |
| 2002/0035461 A1 | * | 3/2002 | Chang et al. | 703/13 |
| 2002/0100903 A1 | * | 8/2002 | Singh et al. | 257/5 |
| 2002/0102482 A1 | * | 8/2002 | Smith et al. | 430/22 |
| 2002/0158193 A1 | * | 10/2002 | Sezginer et al. | 250/237 G |
| 2002/0171828 A1 | * | 11/2002 | Cohen et al. | 356/328 |

* cited by examiner

Primary Examiner—John Barlow
Assistant Examiner—Aditya Bhat
(74) Attorney, Agent, or Firm—Baker Botts L.L.P.

(57) ABSTRACT

A method and apparatus for calibrating a metrology tool are disclosed. The method includes measuring a parameter of a contrast enhanced feature on an artifact using a metrology tool, where the contrast enhanced feature reduces random errors in the metrology tool during the measuring process. The measured parameter is compared with an initial parameter associated with the artifact and the metrology tool is adjusted until the measured parameter matches the initial parameter.

23 Claims, 2 Drawing Sheets

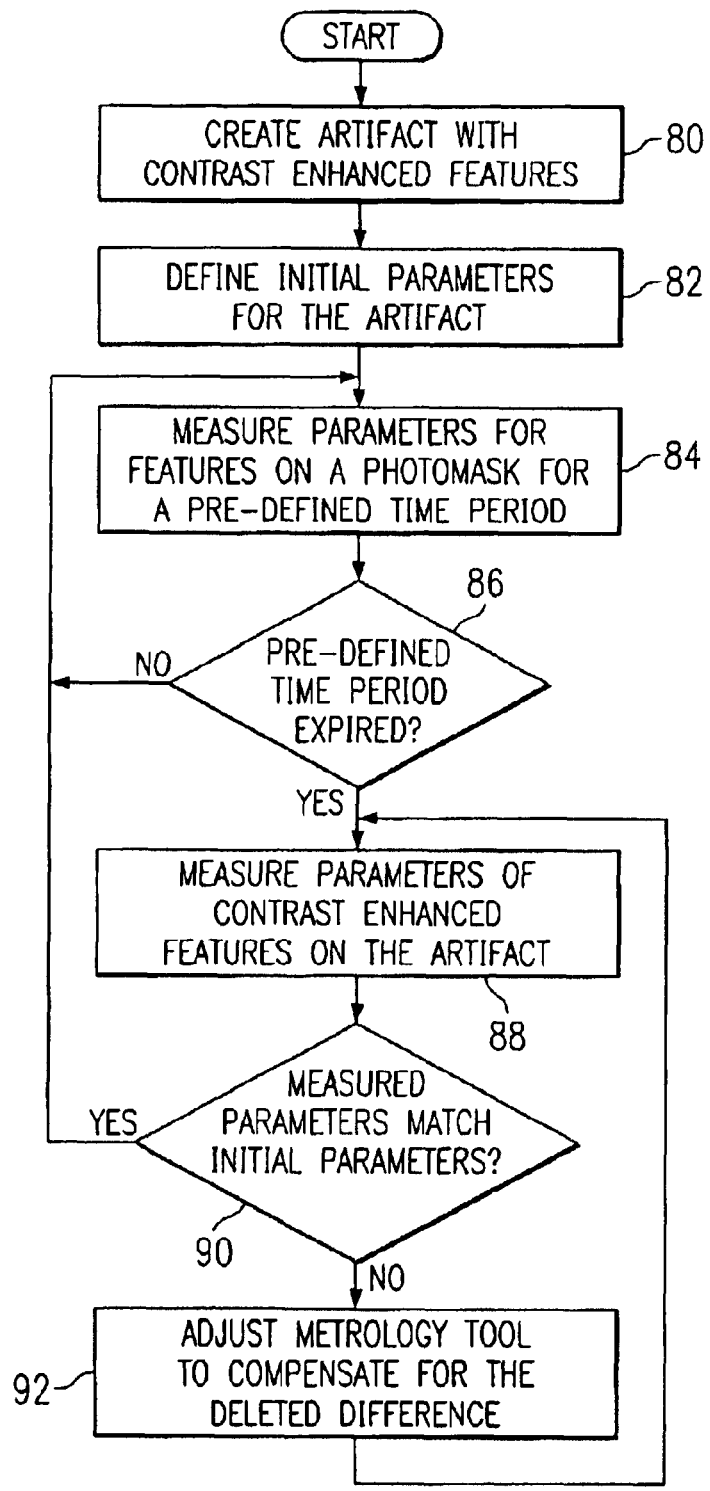

METHOD AND APPARATUS FOR CALIBRATING A METROLOGY TOOL

CROSS REFERENCE TO RELATED APPLICATION

This application claims priority from U.S. Provisional Patent Application Ser. No. 60/303,382, filed Jul. 6, 2001 by Craig West et al., and entitled "Novel Method of Applying Contrast Enhanced Artifact for Registration Tool Matching and Statistical Process Control of an Individual Tool."

TECHNICAL FIELD OF THE INVENTION

This invention relates in general to the field of semiconductor device manufacturing and, more particularly, to a method and apparatus for calibrating a metrology tool.

BACKGROUND OF THE INVENTION

As semiconductor device dimensions in an integrated circuit (IC) become smaller, a specification associated with how the IC should be fabricated becomes more restrictive with respect to the amount of error that is allowable in the process. The specification may provide the requirements that a photomask, also known as a mask or reticle, must meet in order to be used to fabricate semiconductor devices on a wafer. For example, a specification may include the requirements for pattern position accuracy, feature size control and defect density for a specific manufacturing process.

The pattern position accuracy and feature size control on an individual photomask may be measured by a metrology tool. Typically, a metrology tool should have no more than ten percent error relative to the specification in order to provide quality assurance. Today, it is common for advanced photomasks to have specifications of less than forty nanometers, which may limit the requirements for tool-to-tool matching to less than five nanometers. A metrology tool, therefore, must be able to accurately measure a feature on a photomask in order to meet the tool requirements in the specification.

The accuracy of a metrology tool, however, may be affected by systematic and/or random error factors. Systematic factors, such as X-mag, Y-mag and orthogonality, may be used to match different metrology tools to each other and to customer specific grids or footprints. A transfer standard artifact may be the physical vehicle used for tool matching and grid definition to ensure consistent results between different tools in the same manufacturing facility or in different manufacturing facilities. Furthermore, the metrology tools must be kept within process control standards by maintaining.

Tool matching, grid transfers and statistical process control methods may also be effected by random errors that limit the ability to accurately and directly apply measured data from the metrology tool to a higher level of certainty. Therefore, as specifications for a photomask become more challenging, the ability to reduce and resolve random error sources is critical to achieving better results from the metrology tools. If the random errors in a metrology tool can be reduced, the metrology tool may provide more repeatable and accurate measurements for the features on a photomask.

SUMMARY OF THE INVENTION

In accordance with the teachings of the present invention, disadvantages and problems associated with calibrating a metrology tool have been substantially reduced or eliminated. In a particular embodiment, a method for calibrating a metrology tool includes providing an artifact having a contrast enhanced feature that reduces random errors in a metrology tool during a measuring process.

In accordance with one embodiment of the present invention, a method for calibrating a metrology tool includes measuring a parameter of a contrast enhanced feature on an artifact in a metrology tool, where the contrast enhanced feature may reduce random errors in the metrology tool during the measuring process. The method further compares the measured parameter with an initial parameter associated with the artifact and adjusts the metrology tool until the measured parameter matches the initial parameter. Furthermore, an artifact formed in accordance with the teachings of the present invention may be used to calibrate a metrology tool used to measure features on a photomask or a semiconductor wafer.

In accordance with another embodiment of the present invention, an apparatus for calibrating a metrology tool includes a feature formed on at least a portion of the substrate. The feature includes an optical contrast that may reduce random errors in a metrology tool during a measuring process.

In accordance with a further embodiment of the present invention, a photomask includes a patterned layer formed on at least a portion of a substrate. A photomask parameter for a feature in the patterned layer may be measured by calibrating a metrology tool with an artifact that includes a contrast enhanced feature, which may reduce random errors in the metrology tool during a measuring process. The photomask parameter for the feature may then be measured by using the calibrated metrology tool.

Important technical advantages of certain embodiments of the present invention include an artifact that improves the precision and accuracy of the data collected by a metrology tool. One cause for random errors in a metrology tool when reading a mask location may be the limited optical contrast of a feature to its background. The artifact of the present invention may include features that have an enhanced optical contrast compared to the background. By increasing the optical contrast of the features, the metrology tool may be able to more precisely and accurately detect the edges of the features and therefore, obtain a more consistent measurement.

Another important technical advantage of certain embodiments of the present invention includes an artifact that improves the ability to detect and correct systematic errors in a metrology tool. As a metrology tool ages, malfunctions or drift in the optical imaging equipment used to measure the features may require adjustments to restore the metrology tool to proper working order. These malfunctions may be unidentifiable if there are too many random errors during operation. The artifact of the present invention reduces the number of random errors by using enhanced contrast features that may improve the inherent signal to noise factors. By reducing the random errors, systematic errors that occur in the metrology tool may be more easily detected and corrected.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein:

FIG. 3 illustrates a flow chart of a method for calibrating a metrology tool in accordance with the teachings of the present invention.

DETAILED DESCRIPTION

Figure 1:
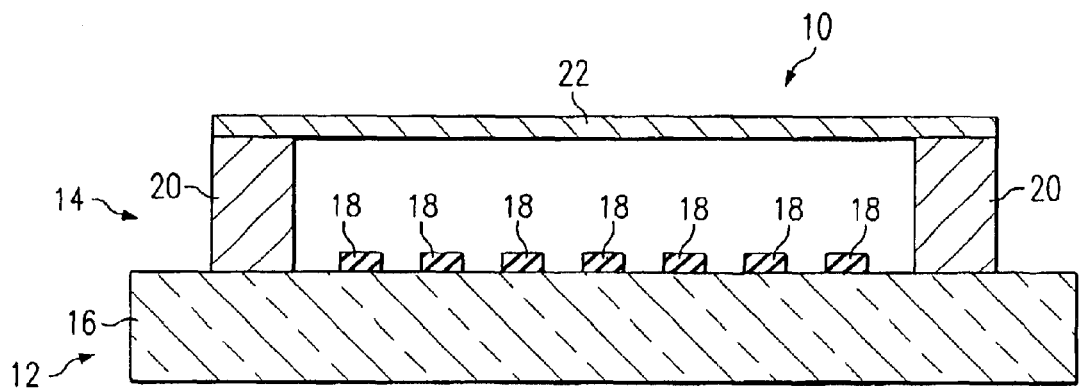
FIG. 1 illustrates a cross-sectional view of a photomask assembly manufactured in accordance with teachings of the present invention.

Preferred embodiments of the present invention and their advantages are best understood by references to FIGS. 1 through 3, where like numbers are used to indicate like and corresponding parts.

FIG. 1 illustrates a cross-sectional view of photomask assembly 10 qualified in a metrology tool calibrated with an artifact including contrast enhanced features. Photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a onetime master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M—O—C—N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and/or VUV ranges. Pellicle film 22 may be prepared by a conventional technique such as spin casting.

Pellicle film 22 protects photomask 12 from dust particles by ensuring that the dust particles remain a defined distance away from photomask 12. This may be especially important in a lithography system. During a lithography process, photomask assembly 10 is exposed to electromagnetic energy produced by a radiant energy source within the photolithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Dust particles collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using a standard lithography process. In a lithography process, a mask pattern file that includes data for patterned layer 18 may be generated from a mask layout file. The mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer from a diffusion layer and a polysilicon layer. The mask layout file, therefore, may include one or more polygons drawn on the diffusion layer (not expressly shown) and one or more polygons drawn on the polysilicon layer (not expressly shown). The polygons for each layer may be converted into a mask pattern file that represents one layer of the integrated circuit. Each mask pattern file may be used to generate a photomask for the specific layer.

The desired pattern may be imaged into a resist layer of the photomask blank using a laser, electron beam or X-ray lithography tool. In one embodiment, a laser lithography tool uses an Argon-Ion laser that emits light having a wavelength of approximately 364 nanometers (nm). In alternative embodiments, the laser lithography tool uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over transparent substrate 16. Photomask 12 may then be placed into a lithography system to project an image onto the surface of a semiconductor wafer. A separate photomask is used for each individual layer of the integrated circuit. For example, one photomask may be used to create the diffusion regions on a wafer and another photomask may be used to create a layer of polysilicon over the diffusion regions.

During a manufacturing process for photomask 12, different parameters of features on patterned layer 18 may be measured to determine if the parameters meet a specification associated with the manufacturing process. The parameters associated with photomask 12 may include pattern position accuracy, also referred to as registration or overlay, and feature size control, also referred to as feature critical dimension. Typically, photomask 12 is placed in an inspection tool, such as a metrology tool, to ensure that the parameters are within the specification.

Photomask manufacturers have multiple manufacturing facilities that each have a different metrology tool. Each photomask, however, should be manufactured to the same specifications. In order to ensure that each photomask is manufactured to the same specification, a transfer standard, also known as an artifact, may be created. The artifact may include one or more features formed on a substrate. The dimensions, spacing between and positions of the features on the substrate may be based on a theoretical specification for the specific manufacturing process. The substrate may be made of a material used as a substrate for photomask 12 or a semiconductor wafer. Each manufacturing facility may have a separate artifact or a single artifact may be used by all facilities. The artifact may be placed in the metrology tools at each facility daily, weekly or with any other suitable frequency during a specific time period.

Each time the artifact is placed in a metrology tool, the known parameters (e.g., placement of the features for registration purposes and dimensions of the feature for critical dimension purposes) are measured to determine if the same values are obtained each time that the artifact is measured. If a difference in the measured parameters occurs, the metrology tool may be adjusted to compensate for malfunctions and/or drifts in measuring caused the optical imaging equipment in the metrology tool.

Another source of errors in the measuring process may come from random variations due to increased noise in the tool. The noise reduces the metrology tool's ability to determine the dimensions, spacing or positions of the feature and can mask or imitate systematic errors that may be caused by the equipment in the metrology tool. In some cases, the random errors may be caused by limited optical contrast between the features and the background (e.g., the substrate). When reading any feature, the metrology tool uses an image of an intensity profile of light and then derives the edges of the features from this profile. If the optical contrast between the features and the background is enhanced, the metrology tool may be able to more precisely locate the edges, and thus the center, of the features on the artifact because the intensity profile will be sharper. The sharper intensity profile may reduce random errors and, thus eliminate a source of noise in the metrology tool to allow the metrology tool to obtain a more accurate and consistent reading of the edges of the features on the artifact.

FIGS. 2A through 2D illustrate cross-sectional views of example artifacts that incorporate teachings of the present invention and may be used to calibrate a metrology tool based on a specification for a desired manufacturing process. The artifacts may include one or more features formed on respective substrates. The substrates may be a transparent material such as quartz, synthetic quartz, fused silica, magnesium fluoride ($MgF_2$), calcium fluoride ($CaF_2$), or any other suitable material that may be used as a substrate on which one or more features may be formed. In an alternative embodiment, the substrates may be a reflective material such as silicon, gallium arsenide or any other suitable material that may be used as a substrate on which one or more layers of features may be formed.

The features may be formed from a material such as chrome, chromium nitride, a metallic oxy-carbo-nitride (M—O—C—N), where the metal is selected from the group consisting of chromium, cobalt, iron, zinc, molybdenum, niobium, tantalum, titanium, tungsten, aluminum, magnesium and silicon, molybdenum silicide (MoSi), silicon dioxide, aluminum, copper, gold or any other material that absorbs and/or reflects a wavelength used by the optical imaging equipment in a metrology tool. In an alternative embodiment, the features may be provided by forming trenches in the substrate.

Figure 2A:
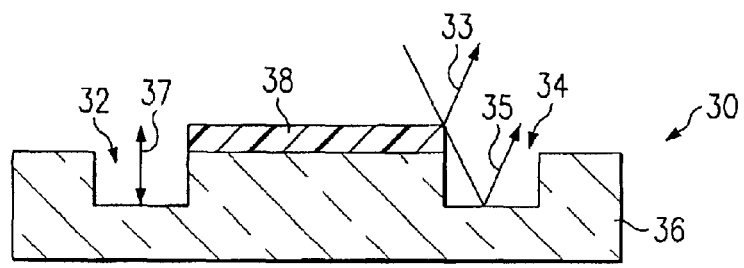
FIGS. 2A through 2D illustrate cross-sectional views of example artifacts that include contrast enhanced features formed in accordance with the teachings of the present invention.

As illustrated in FIG. 2A, artifact 30 may include trenches 32 and 34 formed in substrate 36 and feature 38 formed on substrate 36. Trenches 32 and 34 may allow the edges of feature 38 to be phase shifted by using the wavelength of optical equipment associated with a metrology tool. The phase shift may provide a sharper intensity profile between feature 38 and the background surrounding feature 38 (e.g., substrate 36) and thus, enhance the optical contrast of feature 38. The enhanced optical contrast between feature 38 and substrate 36 may allow a metrology tool to more accurately identify the edges and thus, the center of feature 38.

In one embodiment, trenches 32 and 34 may have depth 37 measured from the upper surface of feature 38 that is approximately equal to $\lambda/4$, where $\lambda$ is approximately equal to the wavelength of light used in the metrology tool. In a metrology tool using reflection to measure the parameters of feature 38, a phase shift of approximately one-hundred eighty degrees (180°) may be created since light ray 35 that is reflected from the bottom of trenches 32 and 34 must travel twice the distance as light ray 33 that is reflected from the surface of feature 38. In another embodiment, trenches 32 and 34 may have a depth that is greater than zero but less than approximately $\lambda/2$, such that the phase shift is greater than zero but less than approximately three-hundred sixty degrees (360°).

In an additional embodiment, a phase shift may be created by eliminating trenches 32 and 34 and increasing the height of feature 38 compared an adjacent surface of substrate 36. In this example, the light reflected from the surface of substrate 36 must travel a greater distance than the light reflected from the adjacent surface of feature 38. Furthermore, by using topography to create a contrast enhanced feature, the edges of the feature may also be measured through atomic force microscopy.

Figure 2B:
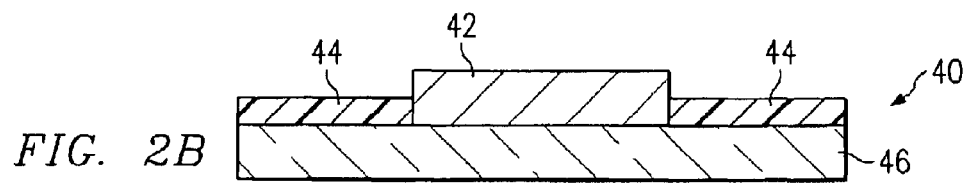

As illustrated in FIG. 2B, artifact 40 may include feature 42 and anti-reflective layer 44 formed on substrate 46. Feature 42 may be made of a material that reflects a large percentage (e.g., greater than approximately fifty percent) of the light incident to the surface of feature 42. In another embodiment, feature 42 may be coated with a thin layer of a material that reflects a large percentage of incident light from the metrology tool. Anti-reflective layer 44 may be made of a material that reflects a small percentage (e.g., less than approximately twenty percent) of the light incident to the surface of anti-reflective layer 44. By adjusting the relative reflection differences between feature 42 and the adjacent surface of substrate 46 by applying anti-reflective layer 44, an enhanced optical contrast between feature 42 and anti-reflective layer 44 may be produced.

In another embodiment, artifact 40 may not include anti-reflective layer 44 on substrate 46. In this example, the enhanced contrast between feature 42 and its background (e.g., substrate 46) may be provided by coating or forming feature 42 with a material that has a greater reflectance at the wavelength used in the metrology tool than the reflectance produced by substrate 44. By increasing the optical contrast between feature 42 and the adjacent surface of substrate 46 and/or anti-reflective layer 44, the metrology tool may be able to more accurately detect the edges of feature 42 since the edge will be defined by a sharp drop in the amount of light reflected from the surface of artifact 40.

Figure 2C:
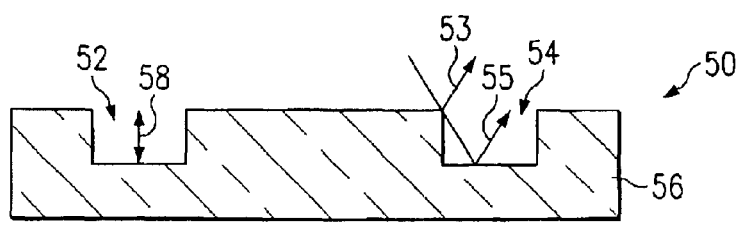

As illustrated in FIG. 2C, artifact 50 may include trenches 52 and 54 formed in substrate 56. Trenches 52 and 54 may have depth 58 that is approximately equal to $\lambda/4$, where $\lambda$ is approximately equal to the wavelength of light used in the metrology tool. In a metrology tool using reflection to measure the parameters of artifact 50, a phase shift of approximately one-hundred eighty degrees (180°) may be created since light ray 55 that is reflected from the bottom of trenches 52 and 54 must travel twice the distance as light ray 53 that is reflected from the surface of substrate 56. In another embodiment, trenches 32 and 34 may have a depth that is greater than zero but less than approximately $\lambda/2$, such that the phase shift is greater than zero but less than approximately three-hundred sixty degrees (360°). By using a homogeneous substrate, a greater accuracy may be obtained since there will be no thermal mismatch between a material that could be used to form features on substrate 56.

Figure 2D:
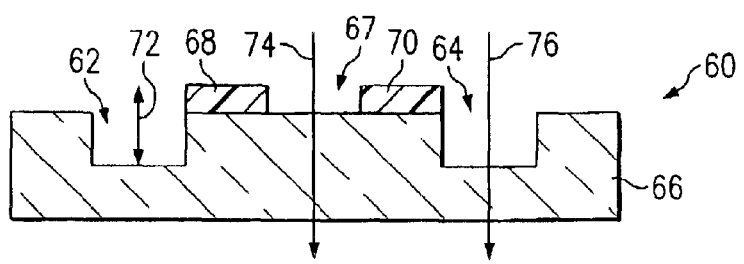

As illustrate in FIG. 2D, artifact 60 may include trenches 62 and 64 formed in substrate 66 and features 68 and 70 formed on substrate 66. Trenches 62 and 64 may have depth 72 measured from the upper surface of feature 68 that is approximately equal to $\lambda/2$, where $\lambda$ is approximately equal to the wavelength of light used by optical imaging equipment in the metrology tool. In a metrology tool using transmission to measure the parameters of features 68 and 70, a phase shift of approximately 180 degrees may be created since light ray 76 that is transmitted through trench 64 travels twice the distance that light ray 74 travels before reaching a surface of substrate 66. In another embodiment, trenches 32 and 34 may have depth 72 that is greater than zero but less than approximately $\lambda$, such that the phase shift is greater than zero but less than approximately 360 degrees.

FIG. 3 illustrates a flow chart of a method for calibrating a metrology tool. Generally, one or more transfer standards, also known as artifacts, are created for a metrology tool. Each artifact may include a pattern of contrast enhanced features that can be measured by different metrology tools to determine parameters associated with the features. The initial parameters for an artifact are determined by placing the artifact in a metrology tool and measuring the parameters. The initial parameters may be more accurate since the contrast enhanced features allow the metrology tool to better determine respective edges of the features. The metrology tool may then be used to measure features on a photomask or a semiconductor wafer. After a predetermined amount of time, the features on the artifact are measured and compared to the initial parameters. If the measured parameters do not match the initial parameters, the metrology tool is adjusted accordingly.

At step 80, an artifact that contains a pattern of contrast enhanced features may be created using a suitable manufacturing technique, such as a manufacturing process used to create a photomask or a semiconductor wafer. The pattern may include a single isolated feature, a pattern of features separated by the same or different size spaces, or any other pattern that may be represented on a photomask or semiconductor wafer. In one embodiment, the contrast enhanced features may be created by adding a phase shift offset to the artifact. In another embodiment, the contrast enhanced features may be created by enhancing the optical contrast between the material used to form the features and the material used for the background. In a further embodiment, the artifact may include phase shifting and an enhanced contrast between the material used to form the features and the background or substrate. The artifact may be a master reticle or a master wafer that is used to calibrate a metrology tool for respectively measuring a photomask or a semiconductor wafer.

At step 82, the artifact may be placed in a metrology tool to create initial parameters for the artifact. The initial parameters for the artifact may include positions of the features, including the positions of the edges and the center of a single feature or multiple features, and the dimensions of the features. In one embodiment, the metrology tool may be a registration tool that measures positions associated with the features to determine if the features associated with one photomask will correctly line up with the features associated with another photomask. In another embodiment, the metrology tool may be a critical dimension tool that measures the line width associated with the features on either a photomask or a semiconductor wafer. The metrology tool may further use optical imaging equipment that generates electromagnetic energy having a wavelength between approximately 600 nm and 200 nm. The optical imaging equipment may also use polarized or non-polarized light.

The initial parameters may be created by comparing measured parameters to a theoretical specification used to manufacture the artifact. If the measured parameters do not match the theoretical specification, the initial parameters may include an error vector that accounts for any positional displacements associated with the features on the artifact. The initial parameters may be more accurate since the metrology tool may be able to detect a sharper intensity profile and determine the edges of the features with more precision due to the enhanced optical contrast of the features to their background.

Once the initial parameters are determined, a photomask or semiconductor wafer may be placed in the metrology tool to measure the features at step 84. The metrology tool may be used for a day, a week or any other predetermined time period to measure features on photomasks or semiconductor wafers. At step 86, an operator or automated system determines if the predetermined time period has expired. If the time period has not expired, the metrology tool may be used to measure parameters associated with features on a photomask or a semiconductor wafer at step 84.

If the predetermined time period has expired, the artifact used to generate the initial parameters may be placed in the metrology tool to measure the features and compare the measured parameters to the initial parameters at step 88. In one embodiment, the metrology tool may measure the parameters of a single feature. For example, the tool may determine the edges of the features and then derive the center of the feature to determine the position of the feature on the artifact. In another embodiment, the metrology tool may measure the parameters of a group of features. The tool may determine the edges of all features in the group and then determine the composite center of the group. Since the artifact includes contrast enhanced features, the metrology tool may provide an increased accuracy of the pitch (e.g., three or more edges of the features) and spacing standards between the features to provide additional process control for the metrology tool.

If the measured parameters match the initial parameters, the metrology tool may be used to measure the features on production photomasks or wafers at step 84. If the measured parameters do not match the initial parameters, the metrology tool may be adjusted at step 92. The contrast enhanced features on the artifact may allow an operator to more accurately adjust the metrology tool since noise is reduced and the operator may be able to more accurate identify any systematic errors in the metrology tool. The technique of using an artifact that contains wavelength specific contrast enhance features may also be used as the wavelength of the optical equipment decreases. Furthermore, a metrology tool that uses digital signal processing (DSP) to enhance the signal in the tool may be improved since the contrast enhanced features may further improve the quality of the signal in the metrology tool. Any DSP functions will further improve the quality of the signal and produce a shaper definition of the edges of the features.

Once the metrology tool has been adjusted, the features on the artifact are measured again to determine if the adjustments have brought the metrology tool into proper order at step 88. The measurements and adjustments may be repeated until the metrology tool is restored to proper working order and the measured parameters match the initial parameters. Furthermore, the steps of measuring a photomask or semiconductor wafer and then calibrating the metrology tool with the artifact may be performed until it is determined that a new artifact should be created for the metrology tool or the manufacturing facility stops using the specific metrology tool.

The above described technique of enhancing optical contrasts of features formed on a substrate may also be applied to photomasks and/or semiconductor wafers. For example, fiducial features that may be formed outside of an active area may be fabricated to have contrast enhanced features. When a metrology tool measures the parameters associated with the fiducials, the tool may be able to more precisely detect the position of the fiducials on the photomask or wafer and determine if the photomask will be properly aligned when placed in a lithography tool or the features on the wafer are properly aligned.

Although the present invention has been described in detail, it should be understood that various changes, substitutions, and alterations can be made without departing from the spirit and scope of the invention as defined by the appended claims.

What is claimed is:

1. A method for calibrating a metrology tool, comprising:
   measuring a parameter of a contrast enhanced feature on a transfer standard artifact using a metrology tool, the contrast enhanced feature creating a phase shift at an edge of the contrast enhanced feature to provide an optical contrast on the artifact to reduce random errors in the metrology tool during the measuring process;
   comparing the measured parameter with an initial parameter associated with the artifact; and
   adjusting the metrology tool until the measured parameter matches the initial parameter.

2. The method of claim 1, wherein the phase shift is greater than approximately zero degrees and less than approximately three-hundred sixty degrees.

3. The method of claim 1, further comprising the contrast enhanced feature formed by providing one or more trenches in a substrate.

4. The method of claim 1, further comprising:
   measuring a plurality of parameters for a plurality of contrast enhanced features on the artifact;
   comparing the measured parameters with initial parameters associated with the artifact; and
   adjusting the metrology tool until the measured parameters match the initial parameters.

5. The method of claim 1, wherein the measured parameter comprises a center position for the contrast enhanced feature, the center position obtained by locating at least two edges of the contrast enhanced feature.

6. The method of claim 1, wherein the measured parameter comprises a dimension for the enhanced contrast feature, the dimension obtained by measuring a distance between at least two edges of the contrast enhanced feature.

7. A method for calibrating a metrology tool, comprising:
   measuring a parameter of a contrast enhanced feature on a transfer standard artifact using a metrology tool, the contrast enhanced feature formed with a material that reflects a large percentage of a wavelength used by the metrology tool to provide an optical contrast on the artifact, the contrast enhanced feature operable to reduce random errors in the metrology tool during the measuring process;
   comparing the measured parameter with an initial parameter associated with the artifact; and
   adjusting the metrology tool until the measured parameter matches the initial parameter.

8. The method of claim 7, wherein the measured parameter comprises at least one of pattern position accuracy and feature size control.

9. The method of claim 7, further comprising the contrast enhanced feature providing an enhanced intensity profile that allows the metrology tool to provide a substantially accurate location of at least one edge of the contrast enhanced feature.

10. A method for calibrating a metrology tool, comprising:
    measuring a parameter of a contrast enhanced feature on a transfer standard artifact using a metrology tool to perform a reflection technique and a transmission technique, the contrast enhanced feature operable to reduce random errors in the metrology tool during the measuring process;
    comparing the measured parameter with an initial parameter associated with the artifact; and
    adjusting the metrology tool until the measured parameter matches the initial parameter.

11. The method of claim 10, further comprising the contrast enhanced feature operable to provide a phase shift of approximately 180 degrees.

12. The method of claim 10, wherein the contrast enhanced feature comprises one or more trenches formed in the artifact.

13. A transfer standard artifact for calibrating a metrology tool, comprising:
    a substrate including one or more trenches associated with the feature, the trenches operable to create a phase shift, the trenches including a depth of greater than zero and less than approximately one-half of a wavelength used by optical equipment associated with the metrology tool; and
    a contrast enhanced feature formed on at least a portion of the substrate, the contrast enhanced feature including an optical contrast operable to reduce errors in a metrology tool during a measuring process.

14. The artifact of claim 13, wherein the phase shift is greater than approximately zero degrees and less than approximately three-hundred sixty degrees.

15. The artifact of claim 13, wherein the metrology tool comprises a registration tool.

16. The artifact of claim 13, wherein the metrology tool comprises a critical dimension tool.

17. A transfer standard artifact for calibrating a metrology tool, comprising:

a substrate; and a contrast enhanced feature formed on at least a portion of the substrate, the contrast enhanced feature including an optical contrast operable to reduce errors in a metrology tool during a measuring process, the contrast enhanced feature including a height of approximately one-quarter of a wavelength used by optical equipment associated with the metrology tool.

18. The artifact of claim 17, further comprising the contrast enhanced feature operable to provide a phase shift of approximately 180 degrees.

19. The artifact of claim 17, further comprising the contrast enhanced feature operable to facilitate measurement by the metrology tool using at least one of a transmission technique and a reflection technique.

20. A transfer standard artifact for calibrating a metrology tool, comprising:

a substrate; and a contrast enhanced feature formed on at least a portion of the substrate, the contrast enhanced feature including an optical contrast operable to reduce errors in a metrology tool during a measuring process, the optical contrast created by forming the feature with a material that reflects a larger percentage of an imaging wavelength used in the metrology tool than the substrate.

21. The artifact of claim 20, further comprising the substrate including an anti-reflective layer formed on exposed portions of the substrate, the anti-reflective layer operable to absorb a larger percentage of the imaging wavelength used in the metrology tool than the feature.

22. The artifact of claim 20, further comprising the contrast enhanced feature operable to provide an enhanced intensity profile that facilitates a substantially accurate location of at least one edge of the contrast enhanced feature by the metrology tool.

23. The artifact of claim 20, further comprising the contrast enhanced feature operable to facilitate measurement by the metrology tool using at least one of a transmission technique and a reflection technique.

* * * * *